(12) United States Patent
Moore et al.

(10) Patent No.: US 7,235,856 B1
(45) Date of Patent: Jun. 26, 2007

(54) TRENCH ISOLATION FOR SEMICONDUCTOR DEVICES

(75) Inventors: John T. Moore, Boise, ID (US); David L. Chapek, Merrimack, NH (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/496,794

(22) Filed: Feb. 2, 2000

Related U.S. Application Data

(62) Division of application No. 08/993,329, filed on Dec. 18, 1997, now Pat. No. 6,051,480.

(51) Int. Cl.
*H01L 29/00* (2006.01)

(52) U.S. Cl. ................................ 257/510; 257/513

(58) Field of Classification Search ................ 257/510, 257/513, 511, 512, 514, 515, 516, 517, 518, 257/519, 521; 438/207, 309, 313, 318, 329, 438/210, 221, 296, 353
See application file for complete search history.

(56) References Cited

U.S. PATENT DOCUMENTS

| | | | | |
|---|---|---|---|---|
| 4,051,506 A * | 9/1977 | Horie | ......................... | 257/511 |
| 5,059,550 A * | 10/1991 | Tateoka et al. | ............. | 438/432 |
| 5,433,794 A * | 7/1995 | Fazan et al. | ................ | 148/33.3 |
| 5,731,241 A * | 3/1998 | Jang et al. | ................... | 438/424 |
| 5,763,932 A * | 6/1998 | Pan et al. | .................... | 257/510 |
| 5,868,870 A * | 2/1999 | Fazan et al. | ................ | 148/33.3 |
| 5,937,308 A * | 8/1999 | Gardner et al. | ............. | 438/424 |
| 5,939,765 A * | 8/1999 | Zheng et al. | ................ | 257/510 |
| 5,940,716 A * | 8/1999 | Jin et al. | ..................... | 438/424 |
| 5,994,756 A * | 11/1999 | Umezawa et al. | .......... | 257/510 |
| 6,002,160 A * | 12/1999 | He et al. | ..................... | 257/513 |
| 6,046,487 A * | 4/2000 | Benedict et al. | ............ | 257/510 |
| 6,064,104 A * | 5/2000 | Omid-Zohoor et al. | ..... | 257/510 |
| 6,093,953 A * | 7/2000 | Pan et al. | .................... | 257/510 |
| 6,268,264 B1 * | 7/2001 | Tseng | .......................... | 438/424 |
| 6,271,561 B2 * | 8/2001 | Doan | .......................... | 257/316 |
| 6,313,010 B1 * | 11/2001 | Nag et al. | .................... | 438/435 |
| 6,355,540 B2 * | 3/2002 | Wu | ............................. | 438/433 |
| 6,727,569 B1 * | 4/2004 | Gardner et al. | ............. | 257/513 |
| 2002/0004285 A1 * | 1/2002 | Wu | ............................. | 438/433 |

* cited by examiner

*Primary Examiner*—Douglas W. Owens
(74) *Attorney, Agent, or Firm*—Fletcher Yoder

(57) ABSTRACT

In etching trench isolation structures, a pad oxide or sacrificial oxide may be formed with substantially the same (or higher) etch rate as the trench filler. Because the etch rate in the trench area is substantially similar to (or less than) the etch rate in the non-trench area, similar amounts of material are removed in both the trench area and non-trench area in a subsequent etching process. Consequently, formation of notches and grooves in the semiconductor structure is minimized. A sacrificial oxide layer may be made by depositing a layer of a suitable material on the surface of a semiconductor structure. By depositing a sacrificial oxide layer instead of thermally growing a sacrificial oxide layer, grooves and the notches in the trench areas are filled by the deposited material.

5 Claims, 3 Drawing Sheets

TRENCH ISOLATION FOR SEMICONDUCTOR DEVICES

This is a divisional of prior application Ser. No. 08/993,329 filed Dec. 18, 1997, now U.S. Pat. No. 6,051,480.

The invention relates to fabricating semiconductor devices and particularly to trench isolation structures.

BACKGROUND

Trenches formed in the substrate and filled with oxide are widely used as isolation structures. Shallow trench structures can be used to isolate adjacent electronic devices, such as transistors. Deep trench isolation structures can be used to isolate N-wells and P-wells in the substrate. The trench isolation technology has proved to be important in fabricating large scale integrated circuits that require high density of electronic devices.

Trench isolation structures may be formed in a semiconductor substrate by depositing silicon dioxide in the isolation trench. A silicon dioxide layer is thermally grown over the surface of a silicon substrate. Next, a silicon nitride layer is deposited by chemical vapor deposition. The layers are then patterned to define the width of a trench to be etched in the silicon substrate. The exposed surface, in this case silicon nitride, is then removed using plasma or chemical etching. Similarly, silicon dioxide is removed by chemical or plasma etching. Following this, the exposed surface of the substrate, in this case silicon, is further removed to create a trench.

After a desired trench depth is obtained, the etch process stops. A thin silicon oxide layer is thermally grown in the trench area. This trench oxide layer is formed to passivate the interior walls and bottom of the trench which may have been slightly damaged during the trench etch.

Upon completion of the trench oxide layer, deposited silicon dioxide is used to fill the trench. After the deposition of silicon dioxide, the substrate is planarized. During planarization, silicon dioxide is removed completely over the silicon nitride hard mask. The silicon nitride layer is subsequently etched away. In this structure, deposited silicon dioxide covers the trench area, whereas thermally grown silicon dioxide, called pad oxide, covers the non-trench area.

In a subsequent step of etching away the pad oxide layer, grooves and notches indicated as "A" may be created in the trench oxide surface area 60a, which is illustrated in FIG. 2.

A sacrificial oxide layer may be thermally grown onto a substrate after trench formation. After implantation, the sacrificial oxide layer typically is removed by chemical etching.

Because thermally grown silicon dioxide can only form in the area where there is silicon, this grown silicon dioxide layer covers only the non-trench area. As a result, the trench area is not covered by additional silicon dioxide. When the sacrificial oxide layer 80a is subsequently etched away, some of the trench fill oxide 60a will be etched away, as indicated at "A" in FIG. 3.

The formation of grooves and notches of this sort may adversely impact the operability and reliability of an integrated circuit.

SUMMARY OF THE INVENTION

In accordance with one aspect of the present invention, a method of fabricating a semiconductor device includes depositing a first material on a surface, the material having a first etch rate. A trench is formed through the first material and into the surface. A trench filler material is deposited in the trench. The deposited trench filler material has an etch rate that is substantially similar to or less than the first etch rate.

In accordance with another aspect of the present invention, a method of providing a sacrificial layer on a semiconductor structure having a trench structure filled with a trench filler material includes depositing a first material over the trench filler material and the surface. The layer is annealed.

In accordance with yet another aspect of the present invention, a semiconductor structure includes a support and a first material deposited on the support. A trench is formed through the first material and into the support. A trench filler material deposited in the trench. The deposited trench filler material has an etch rate that is substantially similar to or less than the etch rate of the first material.

In accordance with still another aspect of the present invention, a semiconductor structure having a trench includes a trench filler material that fills the trench. At least a portion of a second material is deposited on the trench filler material. The second material is annealed.

In accordance with but another aspect of the present invention, a method of forming trench isolation structures in semiconductor devices includes forming a layer on a semiconductor member and forming a trench through the layer and into the member. The trench is filled with a trench filling material. The trench filling material is etched and the layer is removed without forming grooves in the remaining trench filling material.

DETAILED DESCRIPTION OF THE PREFERRED EMBODIMENTS

In the following description, numerous specific details are set forth such as specific thickness, materials, processing sequence, deposition methods, temperature, etch rates, etc. It will be evident to one of ordinary skill in the art that the present invention may be practiced without these specific details. Well known processing steps, equipment, etc., are not described in particular detail.

Figure 1A:
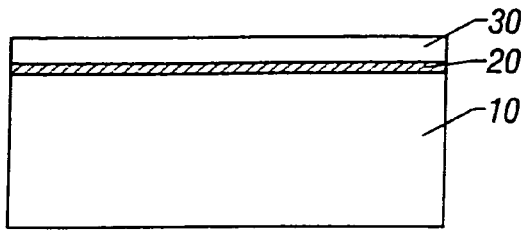
FIGS. 1A-1G are enlarged cross-sectional views of a semiconductor substrate at several steps in fabricating a trench isolation structure according to one embodiment of the present invention.
Figure 5:
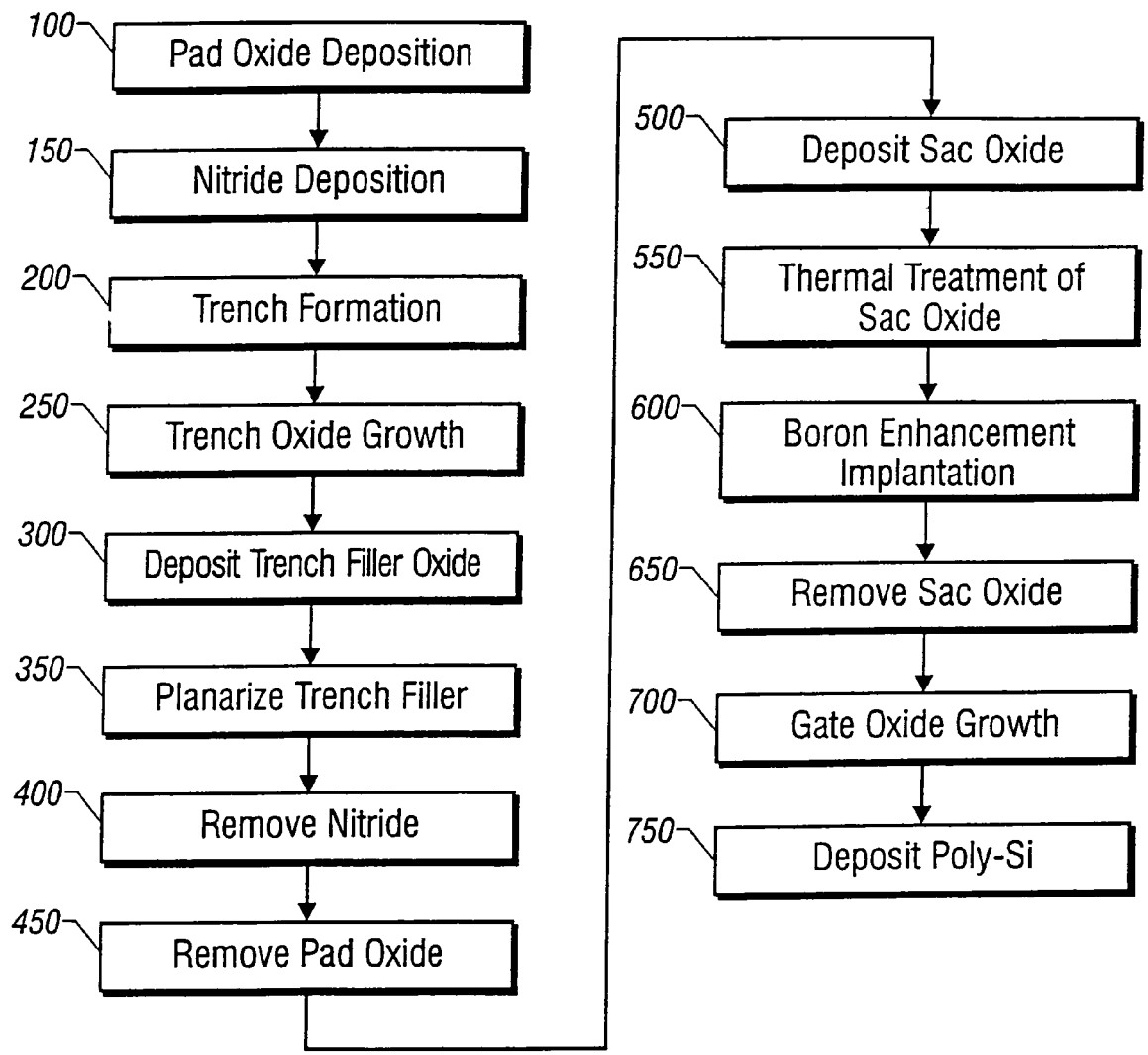
FIG. 5 is a flow diagram of a method of fabricating a device on a semiconductor substrate according to one embodiment of the present invention.

Initially, a pad oxide layer 20 is deposited on the surface of a semiconductor structure 10 as illustrated at step 100 in FIGS. 1A and 5. The semiconductor structure 10 may take various geometric shapes; it may be made of one or more semiconducting materials. The semiconductor structure includes not only a structure formed by a semiconductor, but also a structure formed by a semiconductor and a non-semiconducting material, such as a conductor or an insulator.

The pad oxide layer 20 provides a "pad" or "buffer" to cushion the transition of stress between substrate 10 and subsequent layers. The pad oxide 20 can be formed by depositing $SiO_2$, $Ta_2O_5$, $Al_2O_3$. Deposition methods include low pressure chemical deposition (LPCVD), plasma enhanced vapor deposition (PECVD), and thermal decomposition. Various starting materials known in the art may be used in these deposition methods. For example, to deposit $SiO_2$, tetra-ethylorthosilicate, $SiH_4+O_2$, and $SiH_4+N_2O$, $SiCl_2H_2+N_2O$ may be used. In one embodiment, $SiO_2$ is deposited at 660° C. in a LPCVD reactor by decomposing tetraethylorthosilicate, $Si(OC_2H_5)_4$. This compound, also known as TEOS, is vaporized from a liquid source. The overall reaction is:

$Si(OC_2H_5)_4 \rightarrow SiO_2$+by products, where the byproducts include a complex mixture of organic and organosilicon compounds. During the deposition, the pressure of the reaction chamber may be maintained at approximately 1 Torr. The thickness of the $SiO_2$ pad oxide layer 20 can be about 60 Å, for example.

There are some important differences in physical properties between thermally grown silicon dioxide and deposited silicon dioxide. Thermally grown silicon dioxide consists of stoichiometric $SiO_2$, while deposited silicon dioxide contains $SiO_2$ and other impurities such as carbon, hydrogen, and water. Another difference is in their etch rates. Thermally grown silicon dioxide has an etch rate of 25 Å per minute in an HF solution ($H_2O:HF:100:1$). In contrast, the etch rate of a deposited silicon dioxide is generally equal to or greater than 30 to 50 Å per minute. In the case of plasma deposited silicon dioxide at a low temperature, the etch rate in such a solution may be as high as 400 Å per minute.

At step 150 in FIG. 5, silicon nitride layer 30 is deposited, as shown in FIG. 1A. Methods for depositing silicon nitride are generally well known in the art. For example, silicon nitride can be chemically deposited by reacting silane and ammonia at the atmospheric pressure at a temperature between 700 and 900° C. or by reacting dichlorosilane and ammonia at a reduced pressure at a temperature between and 700 and 800° C. Typically, the pressure of the reaction chamber is maintained around 250 millitorr. The silicon nitride layer can have a thickness of 2000 Å, for example.

Figure 1E:
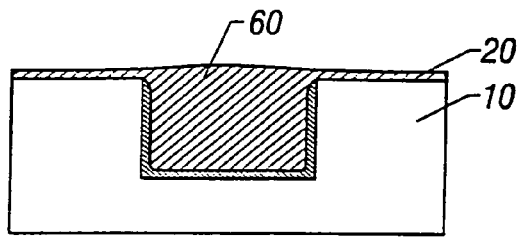
Figure 1B:
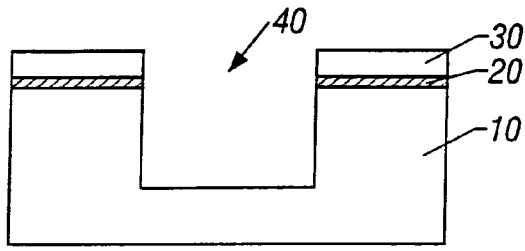

Once the pad oxide layer 20 and silicon nitride layer 30 have been deposited, a trench 40, as illustrated in FIG. 1B, is formed in the structure 10 at step 200. One method of forming the trench is to first cover the layers 20 and 30 on the structure 10 with a photoresist layer (not shown), which is then masked, exposed, and developed to define openings in the photoresist layer where trenches are formed in the substrate. Then, the silicon nitride and pad oxide are etched in the defined trench areas. Etching may be achieved by using a plasma etch method with a chemistry including HBr and $NF_3$ or $SiF_4$. Other etch methods known in the art may also be used.

After the trench has been formed in the substrate, a trench oxide layer 50 (FIG. 1C) is formed at step 250. The oxide layer may be thermally grown or deposited. For example, a 150 Å $SiO_2$ layer can be thermally grown in an oxygen ambient.

At step 300, a trench filler material 60 (FIG. 1D) is deposited in the trench to fill the trench. Advantageously, the trench filler material should have an etch rate that is substantially similar to or less than that of the pad oxide deposited at step 100. A trench filler material has a substantially similar etch rate to that of the pad oxide if the ratio between the two etch rates is less than 1.2. One way to achieve such a result is to use the same deposition process at step 300 as the one used at step 100. In one embodiment, TEOS is used to deposit silicon dioxide in both step 100 and step 300 by LPCVD. In addition to TEOS, silane or dichlorosilane may also be used to deposit silicon dioxide. In another embodiment, plasma enhanced chemical vapor deposition is used to deposit silicon dioxide. Plasma may be initiated by radio frequency, microwave or by a thermal method.

Although silicon dioxide is used in one embodiment, it is to be understood that other materials may be used as the trench filler material and the pad oxide, such as $Al_2O_3$. Advantageously, the trench filler material and the pad oxide layer material are electrically insulating, act as a stress transition layer if deposited between layer 30 and substrate 10 and may be etched away without substantial difficulty.

After the trench 40 has been filled by the trench filler material 60, the excess trench filler material is planarized at step 350. Planarization methods are well known in the art. If the trench filler material 60 is silicon dioxide deposited using TEOS, a chemical mechanical polish (CMP) can be used to remove the excess silicon dioxide. Here, a polish slurry with a chemistry including KOH and silica is used while the excess trench filler material is being polished by a polishing pad.

After planarizing the excess trench filler material, the silicon nitride layer 30 is removed at step 400 of FIG. 5 by such methods as wet chemical etch, reactive ion etching, reactive ion beam etching, and microwave plasma etching. For example, $CF_4+O_2$ may be used in plasma etching of silicon nitride.

Figure 1F:
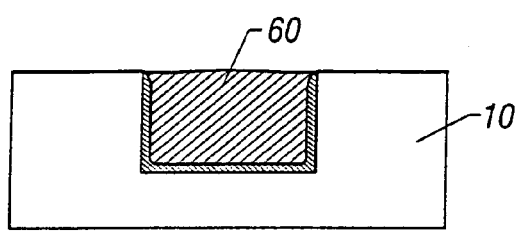
Figure 1C:
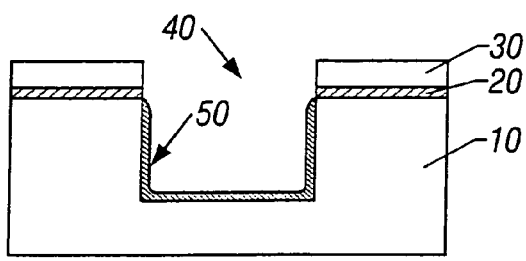

After the silicon nitride layer 30 has been removed, as shown in FIG. 1E, the trench area is covered by trench filler material 60, whereas the non-trench area is covered by pad oxide layer 20. Because the trench filler material 60 and pad oxide layer 20 may have substantially similar etch rates, they are removed at a substantially similar rate at step 450. Any known etch method may be used so long as the etch rate in the trench area is substantially similar to (or less than) the etch rate in the non-trench area. In one embodiment where both the trench filler material and the pad oxide include silicon dioxide deposited from TEOS by LPCVD, an HF solution is used as the etchant. The ratio of HF to $H_2O$ is in the range of 10:1 to 100:1. After the pad oxide layer 20 is removed at step 450, a semiconductor device with a trench filled by a trench filler material is obtained (FIG. 1F).

Because of the substantially similar etch rates of the pad oxide 20 and trench filler oxide 60, the pad oxide 20 can be etched while still maintaining the trench area substantially free of notches or voids. The presence of notches or voids may be detrimental to the performance of an electronic device. If polysilicon particles fall into these notches or voids, shorts may occur between devices that the trench is supposed to isolate. Such a notch may cause transistor characteristics to be non-ideal. For example, the threshold voltage may be lower at a notch.

Figure 1G:
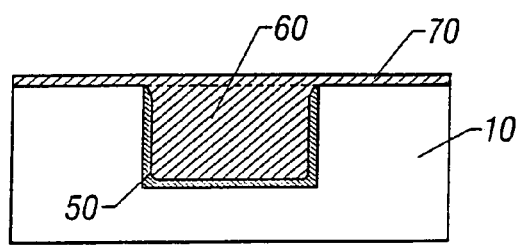
Figure 1D:
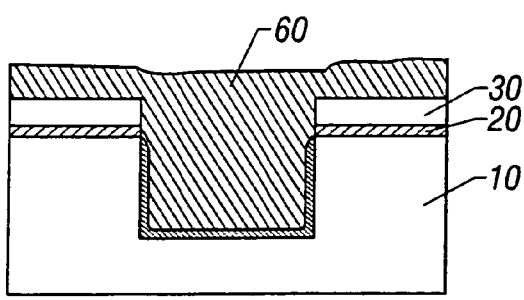
Figure 2:
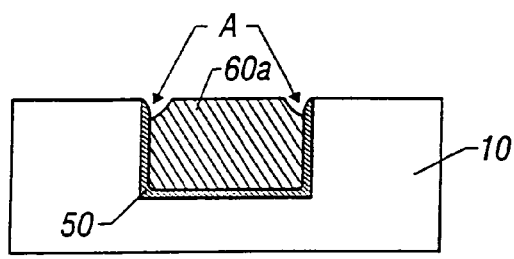
FIG. 2 is an enlarged cross-sectional view of a semiconductor trench isolation structure according to a prior art method.

In one embodiment, a sacrificial oxide layer 70 is (FIG. 1G) is deposited at step 500 (FIG. 5). The thickness of the sacrificial oxide layer may be about 250 Å, for example. In comparison to thermally grown silicon oxide as a sacrificial oxide layer, deposited oxide can fill grooves and notches in the trench area created during etching. This advantage may further be enhanced by a thermal annealing step (step 550).

In this step, the as-deposited oxide layer is subjected to a heat treatment at a temperature above about 900° C. to densify the deposited material. Other known thermal annealing methods can be used.

The annealing step may be done in an oxidizing environment to form a thin grown oxide which is part of the layer 70. Alternatively, a thin grown oxide may be formed before the rest of the sacrificial oxide layer 70 is formed by deposition.

After annealing, a threshold voltage adjustment implant may be performed at step 600. The implanted dopant may be boron or phosphorus, for example. At step 650, the sacrificial oxide layer is removed by etching. At step 700, a gate oxide is grown, followed by depositing polysilicon or silicide onto the gate oxide. Transistors are then formed in the ensuing steps using conventional techniques.

Figure 4A:
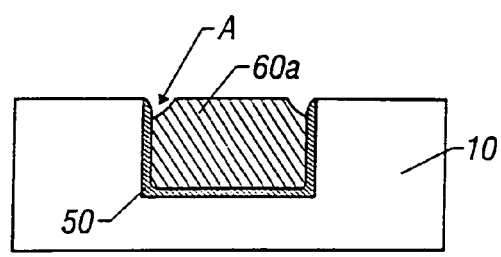
FIGS. 4A-4B are enlarged cross-sectional views of a semiconductor substrate showing the process for making a sacrificial oxide layer on a semiconductor substrate with a trench isolation structure according to one embodiment of the present invention.
Figure 3:
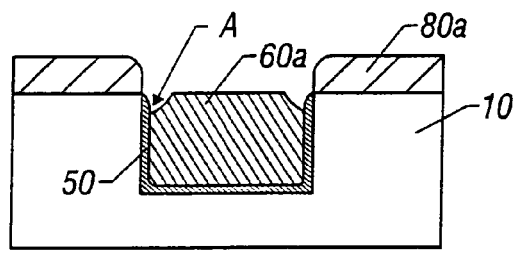
FIG. 3 is an enlarged cross-sectional view of a sacrificial oxide layer on a semiconductor substrate with a trench isolation structure according to a prior art method.
Figure 4B:
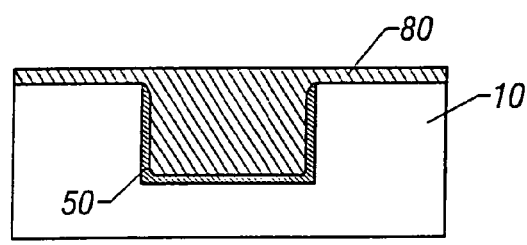

In FIG. 4A, a semiconductor substrate 10 with a trench isolation structure made by a prior art method is shown. Such a structure has notches and grooves "A" in the trench area. In FIG. 4B, an oxide layer 80 is deposited on the surface formed by the trench filler material and the substrate. In one embodiment, silicon dioxide is deposited from TEOS by LPCVD. It is to be understood that the etch rate of the sacrificial oxide is not required to be similar to that of the trench filler material. However, it is advantageous to select an oxide that has an etch rate substantially similar to the etch rate of the trench filler material. Because silicon oxide is deposited rather than thermally grown, the deposited oxide may fill the notches and grooves in the trench area. In another embodiment, silicon dioxide is deposited from a silane and oxygen gas mixture. Any deposition method known in the art, such as LPCVD or PECVD, may be used. Advantageously, the as-deposited sacrificial oxide layer is annealed and densified at a temperature above 900° C.

While the present invention has been disclosed with respect to a limited number of embodiments, those skilled in the art will appreciate numerous modifications and variations therefrom. It is intended that the appended claims cover all such modifications and variations as fall within the true spirit and scope of the present invention.

What is claimed is:

1. A semiconductor structure, comprising:
   a support;
   a first material deposited on said support, said first material being a dielectric having a first etch rate;
   a trench formed through said first material and into the support; and
   a trench filler material deposited in the trench, the trench filler material having an etch rate that is less than 1.2 times the first etch rate and substantially similar to or less than the first etch rate, the semiconductor structure having a planar exposed upper surface formed of said first material and said trench filler material.

2. The semiconductor device of claim 1, wherein the first material includes silicon dioxide deposited from tetraethylorthosilicate or a silane and oxygen system.

3. The semiconductor device of claim 1, wherein the first material includes silicon dioxide deposited by chemical vapor deposition.

4. The semiconductor device of claim 1, wherein the trench filler material includes silicon dioxide deposited from tetraethylorthosilicate or a silane and oxygen system.

5. The semiconductor device of claim 1, wherein the trench filler material includes silicon dioxide deposited by chemical vapor deposition.

* * * * *